(12) United States Patent
Hsu

(10) Patent No.: US 6,326,257 B1
(45) Date of Patent: Dec. 4, 2001

(54) METHOD OF FABRICATING STATIC RANDOM ACCESS MEMORY WITH SPACERS

(75) Inventor: Shih-Ying Hsu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/782,635

(22) Filed: Feb. 13, 2001

(51) Int. Cl.[7] ................................................ H01L 21/8244
(52) U.S. Cl. ........................ 438/238; 438/210; 438/595
(58) Field of Search ................................ 438/200, 210, 438/238, 381, 595, 655

(56) References Cited

U.S. PATENT DOCUMENTS

| | | | |
|---|---|---|---|
| 5,264,385 | * 11/1993 | Roberts | 438/238 |
| 5,416,034 | * 5/1995 | Bryant | 438/238 |
| 5,770,496 | * 6/1998 | Roberts | 438/238 |

* cited by examiner

*Primary Examiner*—Chandra Chaudhari
(74) *Attorney, Agent, or Firm*—Charles C. H. Wu; Charles C. H. Wu & Associates (57) ABSTRACT

A method of fabricating a static random access memory. A stacked gate is formed on a substrate. A lightly doped drain region and a lightly doped source region are formed in the substrate. A thin spacer is then formed on a sidewall of the stacked gate on the lightly doped source region only. However, this thin spacer does not completely cover the lightly doped source and drain regions, that is, portions of the light doped source and drain regions are exposed. A thick spacer is then formed on the other sidewall of the stacked gate on the lightly doped drain region only. Using both the thin and the thick spacers as a mask, an ion implantation is performed to form a heavily doped source region and a heavily doped drain region in the substrate. A self-aligned silicide step is performed to form a salicide layer on the stacked gate, the source and the drain regions.

18 Claims, 13 Drawing Sheets

METHOD OF FABRICATING STATIC RANDOM ACCESS MEMORY WITH SPACERS

BACKGROUND OF THE INVENTION

1. Field of the Invention

The invention relates in general to a method of fabricating a memory device. More particularly, the invention relates to a method of fabricating a random access memory (SRAM).

2. Description of the Related Art

A static random access memory is a kind of semiconductor memory with a very high processing speed. In the typical design, a static random access memory comprises four transistors and two resistors (4T2R) or six transistors (6T). According to the demands of low power/low voltage, the static random access memory with six transistors is more stable.

Figure 1:
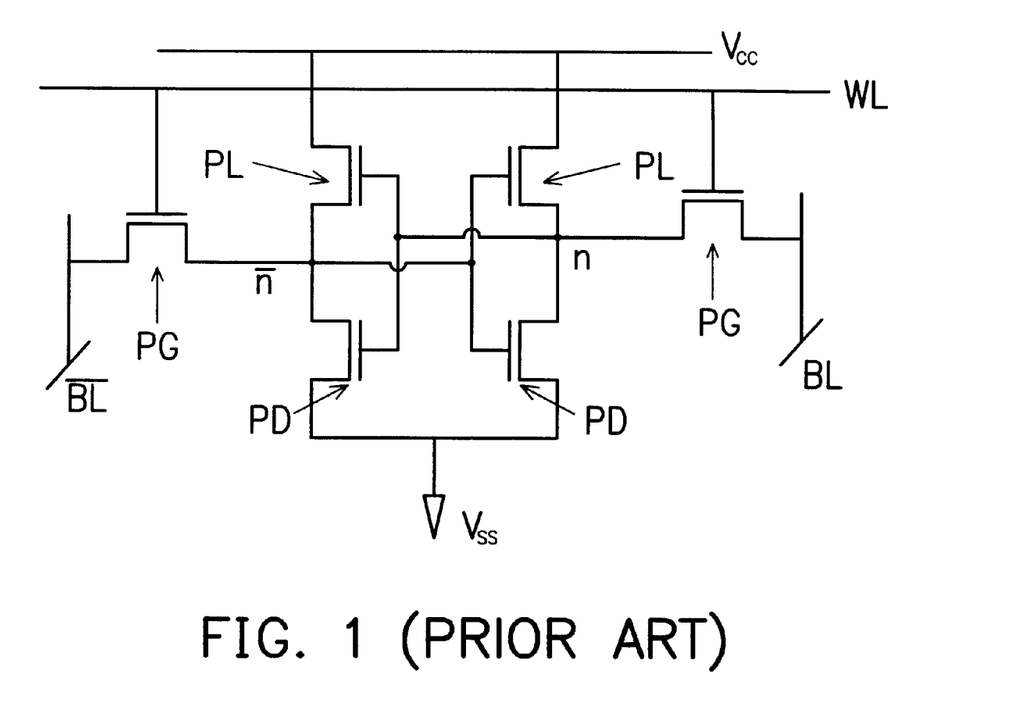
FIG. 1 shows a circuit structure of a conventional static random access memory comprising six transistors.

According to the different functions, the static random access memory comprises different memory cells such as pull down device (PD), P type load device (PMOS load device, PL) and pass gate device (PG). The circuit structure is shown as FIG. 1. As the dimension of the device shrinks, the stability becomes more important while the operation voltage of the memory cell in the static random access memory is dropped lower than 1.8 V.

Generally speaking, when the cell ratio of current between the pull down device and pass gate device is larger, the stability of the memory cell is higher. The typical memory cell fabrication method enhances the stability by increasing the current of the pull down device. However, to increase the operation speed of devices, the current of the pass gate device has to be increased. Consequently, the cell ratio is decreased, and the stability of the devices is lowered. Therefore, there is a tradeoff between the enhancement of the stability and the operation speed.

Figure 2:
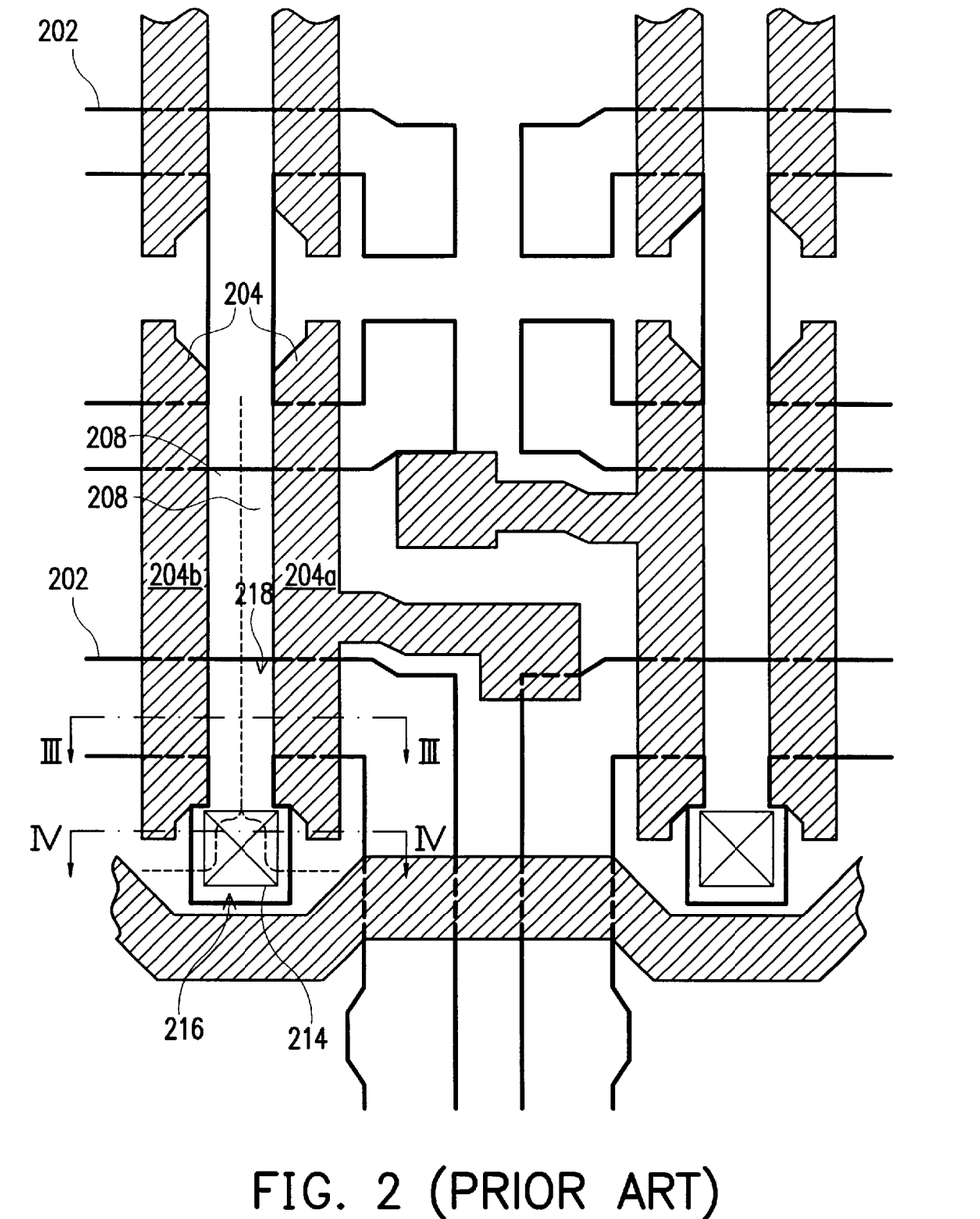
FIG. 2 shows a top view of a conventional static random access memory.
Figure 3:
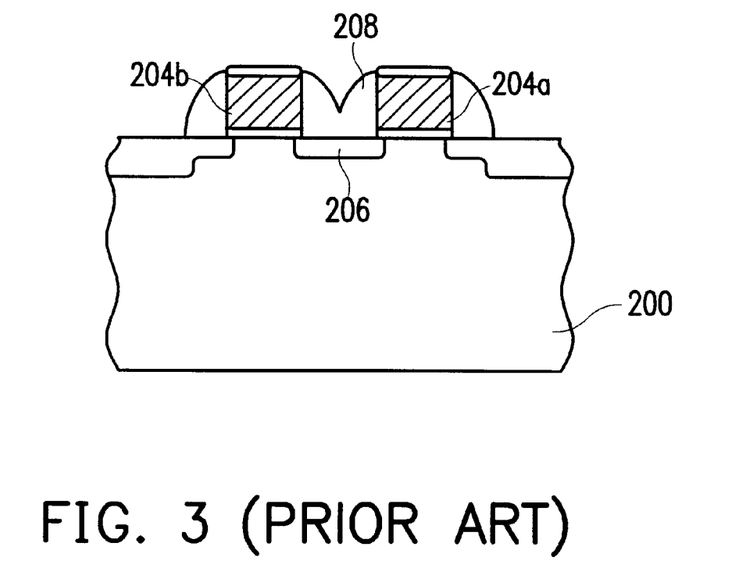
FIG. 3 shows a cross sectional view along the line III—III of the static random access memory as shown in FIG. 2.
Figure 4:
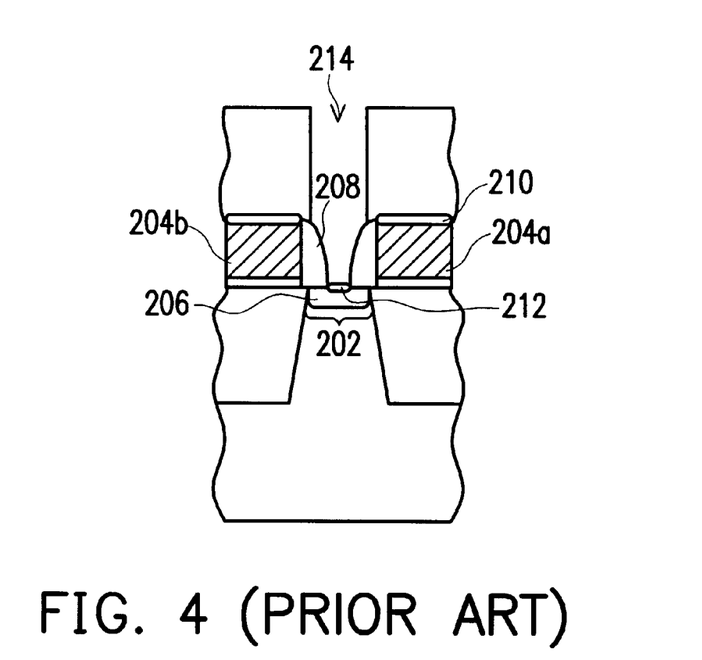
FIG. 4 shows a cross sectional view along the line IV—IV of the static random access memory as shown in FIG. 2; and FIG. 5 to FIG. 18 shows an embodiment of a method for fabricating a static random access memory according to the invention.

The method of fabricating a conventional static random access memory is shown as FIGS. 2, 3 and 4. FIG. 3 is a cross sectional view cutting along the line III—III of FIG. 2, while FIG. 4 is a cross sectional view cutting along the line IV—IV. The conventional method includes forming the stacked gate of a pull down device, a PMOS load device, and a gate pass device 204, a lightly doped drain/source region 206, and a spacer 208 on each sidewall of the stacked gate 204 after an active region 202 is defined. A heavily doped ion implantation is performed, followed by a self-align silicide process to form a heavily doped drain/source region and metal silicide layers 210 and 212 thereon. A contact window 214 is then formed, and the following metallization process is performed.

As the spacer 208 has a significant thickness, the lightly doped source region 206 between the stacked gates of two neighboring memory cells 204a and 204b is covered with the spacer 208 as shown in FIG. 3. Only a predetermined contact window region 216 of the lightly doped source region 206 is exposed, as shown in FIG. 4. Thus, in the subsequent processes of heavily doped ion implantation and self-align silicidation, the heavily doped source region and the metal silicide layer are formed only on the contact region 216. No heavily doped source region and metal silicide layer will be formed on the non-contact region 218.

When the current flows from the drain region of the pull down device through the source region of the non-contact region 218, being blocked by the spacer 208, the source region comprises only the lightly doped source region. Therefore, a very high resistance is incurred.

In addition, while forming a contact window 214 to connect a ground voltage Vss on the lightly doped source region 206, once misalignment occurs, the contact window 214 shifts towards the non-contact region 218, to partly be on the spacer 208 on the non-contact region 218. As a result, the contact area between the contact window 214 and the contact region 216 is decreased, so that the resistance of the source region is greatly increased.

The above conventional method for fabricating the static random access memory increases the resistance of the source region. Consequently, the current of the pull down device is reduced to reduce the cell ratio. The stability of the static random access memory is thus greatly affected.

SUMMARY OF THE INVENTION

The invention provides a method of fabrication a static random access memory with a reduced resistance of the source region.

The method provided by the invention further has the advantage of maintaining the cell ratio between the pull down device and the pass gate device while operating the low power/low voltage static random access memory.

In one embodiment of the invention, the method of fabricating a static random access memory comprises the following steps. A stacked gate is formed on a substrate. A lightly doped source region and a lightly doped drain region are formed in the substrate. A thin spacer is formed on one sidewall of the stacked gate. The thin spacer covers only a part of the lightly doped source region, such that the other part of the lightly doped source region is exposed. A thick spacer is formed on the other sidewall of the stacked gate on the lightly doped drain region only. Using the thin and thick spacers as a mask, an ion implantation step is performed to form a heavily doped source region and a heavily doped drain region. A self-aligned silicidation step is performed to form a metal silicide layer on the stacked gate, a source region including the lightly and the heavily doped source regions, and a drain region including the lightly and the heavily doped drain region.

In the above embodiment, a cap layer is formed on a gate conductive layer of the stacked gate before performing a photolithography and etching step on the stacked gate. A stacked gate with a cap layer is then defined using the photolithography and etching step. A thin spacer is then formed on each sidewall of the stacked gate. A patterned photoresist layer is formed to cover a side of the substrate and one of the thin spacers. Using the patterned photoresist layer as a mask, one of the thin spacers is removed to leave the thin spacer on only one of the sidewalls of the stacked gate. The photoresist layer and the cap layer are removed. An insulating layer is formed over the substrate. The insulating layer is then etched back using anisotropic etching to form a thick spacer on the exposed sidewall of the stacked gate. Meanwhile, a residue of the insulating layer is remained around the thin spacer. The residue of the insulating layer is then removed to leave the thin spacer on one sidewall, and the thick spacer on the other sidewall of the stacked gate. Using the thin and thick spacers as a mask, an ion implantation is performed to form a source region including a heavily and a lightly doped source region and a drain region including a heavily and a lightly doped drain region in the substrate. Using a self-aligned silicidation, a metal silicide layer is formed on the stacked gate, the source region and the drain region.

As the thin spacer has a thickness far smaller than the conventional spacer, a metal silicide layer with a larger area can thus be formed on the source region to reduce the resistance thereof. As a result, the cell ratio between the pull down device and the pass gate device under the low voltage operation condition can thus be increased. The stability can thus be enhanced.

In the invention, only the gate oxide layer at the side of the drain region has a bird's beak shape. The gate oxide layer at other places is thin and uniform. Therefore, not only the drain leakage current incurred by the gate can be reduced, but also the resistance of the source region can be reduced. As a result, the cell ratio between the pull down device and the pass gate device of the low power/low voltage is maintained during operation. The stability of the static random access memory is increased.

Both the foregoing general description and the following detailed description are exemplary and explanatory only and are not restrictive of the invention, as claimed.

DESCRIPTION OF THE PREFERRED EMBODIMENTS

Figure 5:
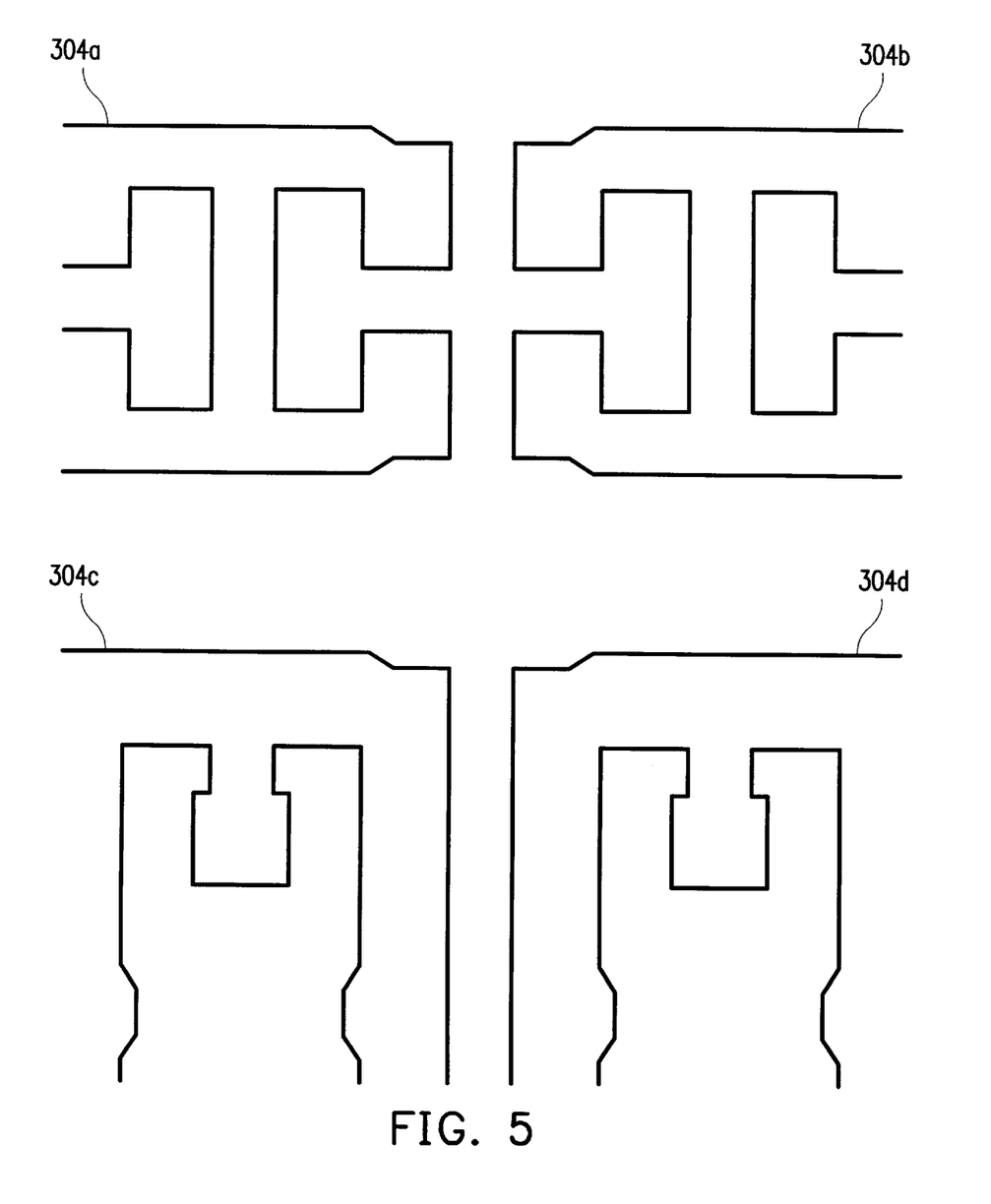

FIG. 5 to FIG. 18 shows an embodiment of a method for fabricating a static random access memory according to the invention In FIG. 5, an isolation region 302 is formed in a substrate 300 to define active regions 304a, 304b, 304c and 304d. The method of forming the isolation region 302 includes, for example, shallow trench isolation (STI) and local oxidation (LOCOS).

Figure 6:
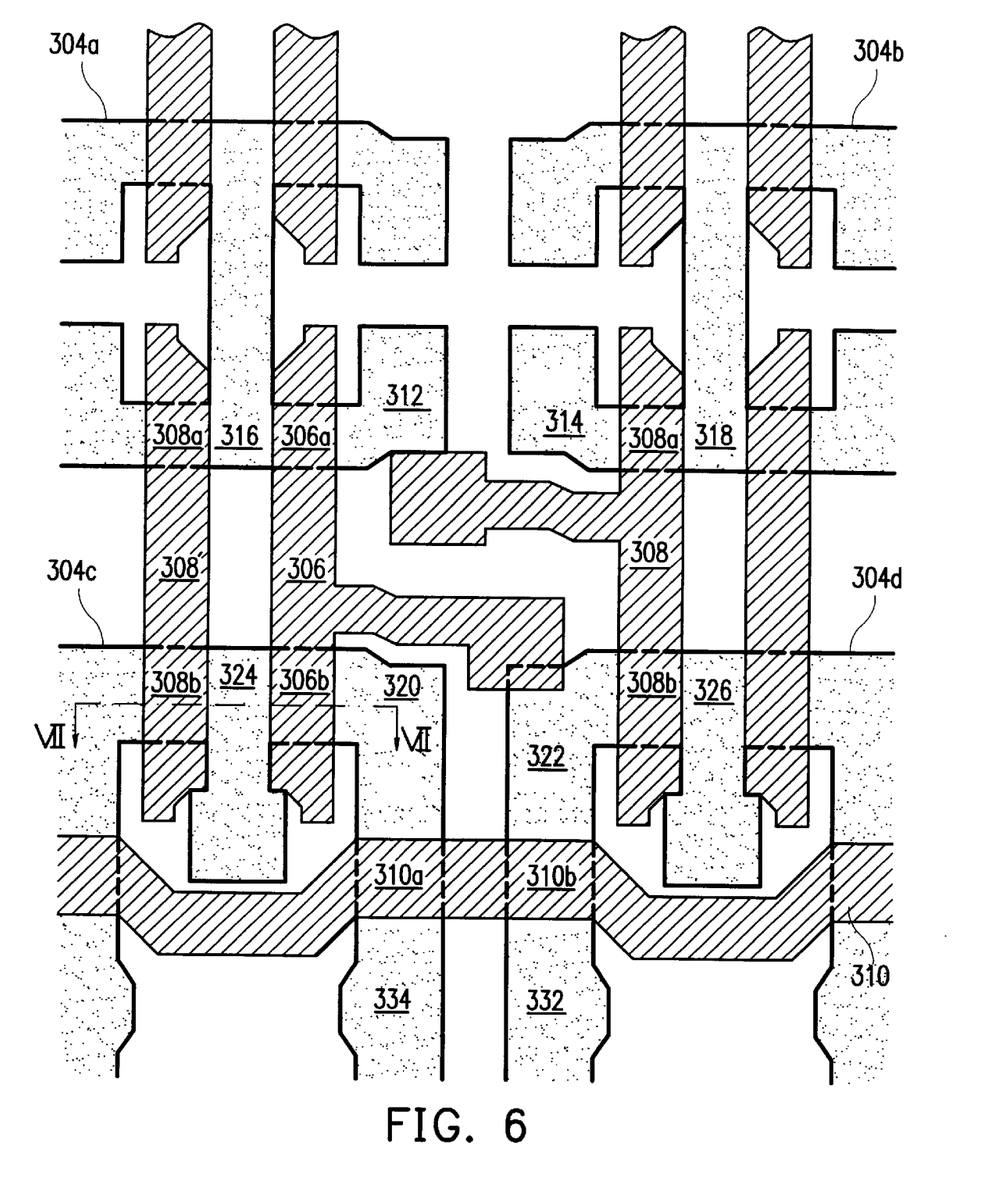
Figure 7:
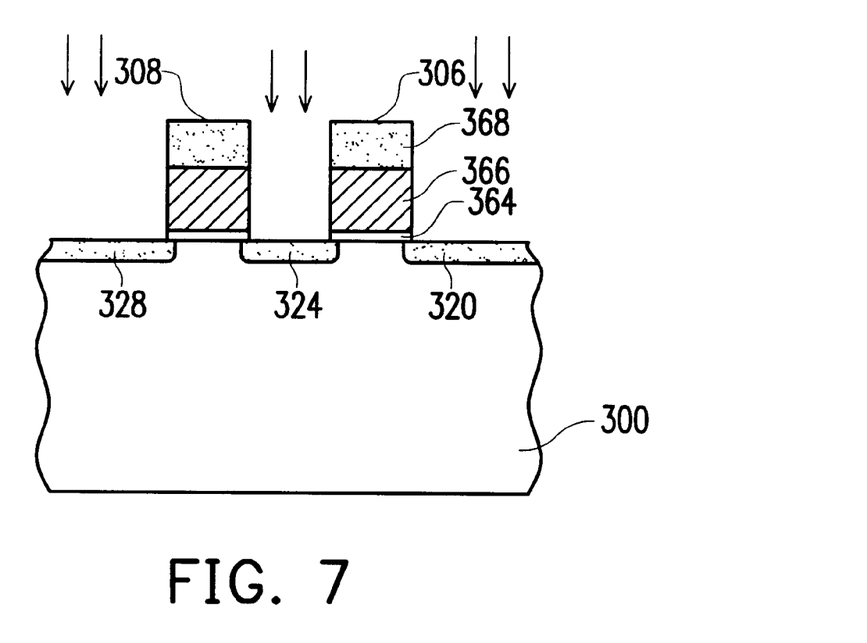

FIG. 7 is a cross sectional view cutting along the line VII—VII. Referring to FIGS. 6 and 7, stacked gates 306, 308, 310 and 308' are formed on the substrate. The stacked gates 306, 308 and 310 belong to the same memory cell, while the stacked gate 308' belongs to another memory cell. In this embodiment, the memory cell with the stacked gates 306, 308 and 310 is used as an example for detailed explanation. The method for forming the stacked gates 306, 308 and 310 and 308' is the same. The stacked gates 306, 308 and 310 comprise an oxide layer 364, a conductive layer 366 and a cap layer 368. Preferably, the oxide layer 364 includes a silicon oxide layer formed by thermal oxidation. The conductive layer 366 includes, for example, a combination of a polysilicon layer and a metal silicide layer. The method for forming the conductive layer 366 includes a low pressure chemical vapor deposition (LPCVD), for example. It is preferably doped with dopant to increase the conductivity. The doping step can be performed in-situ or after the deposition of the polysilicon layer. The cap layer 368 includes a silicon nitride layer formed by chemical vapor deposition. After covering the substrate 300 with an oxide layer, a polysilicon layer, a metal silicide layer and a cap layer, a photolithography and etching step is performed to pattern the stacked gates 306, 308 and 310 comprising the oxide layer 364, the conductive layer 366 and the cap layer 368.

The stacked gate 306 across the active regions 304a and 306a is the stacked gate of a load device, for example, a PMOS load device. The stacked gate 306 across the active regions 304c and 306b is the stacked gate of a pull down device, for example, an NMOS transistor. The stacked gate 308 across the active regions 304b and 308a is the stacked gate of another p type load device of the static random access memory. The stacked gate 308 across the active regions 304d and 308b is another pull down device of the static random access memory. The portion 310a of the stacked gate 310 across the active region 304c is the stacked gate of a pass gate device, for example, an NMOS, of the static random access memory.

An ion implantation step is performed. Lightly doped drain regions 312, 314, 320, 322, and 328 and lightly doped source regions 316, 318, 324, 326, 332 and 334 are formed in the active regions 304a, 304b, 304c and 304d at two sides of the stacked gates 306, 308, 308' and 310.

Figure 8:
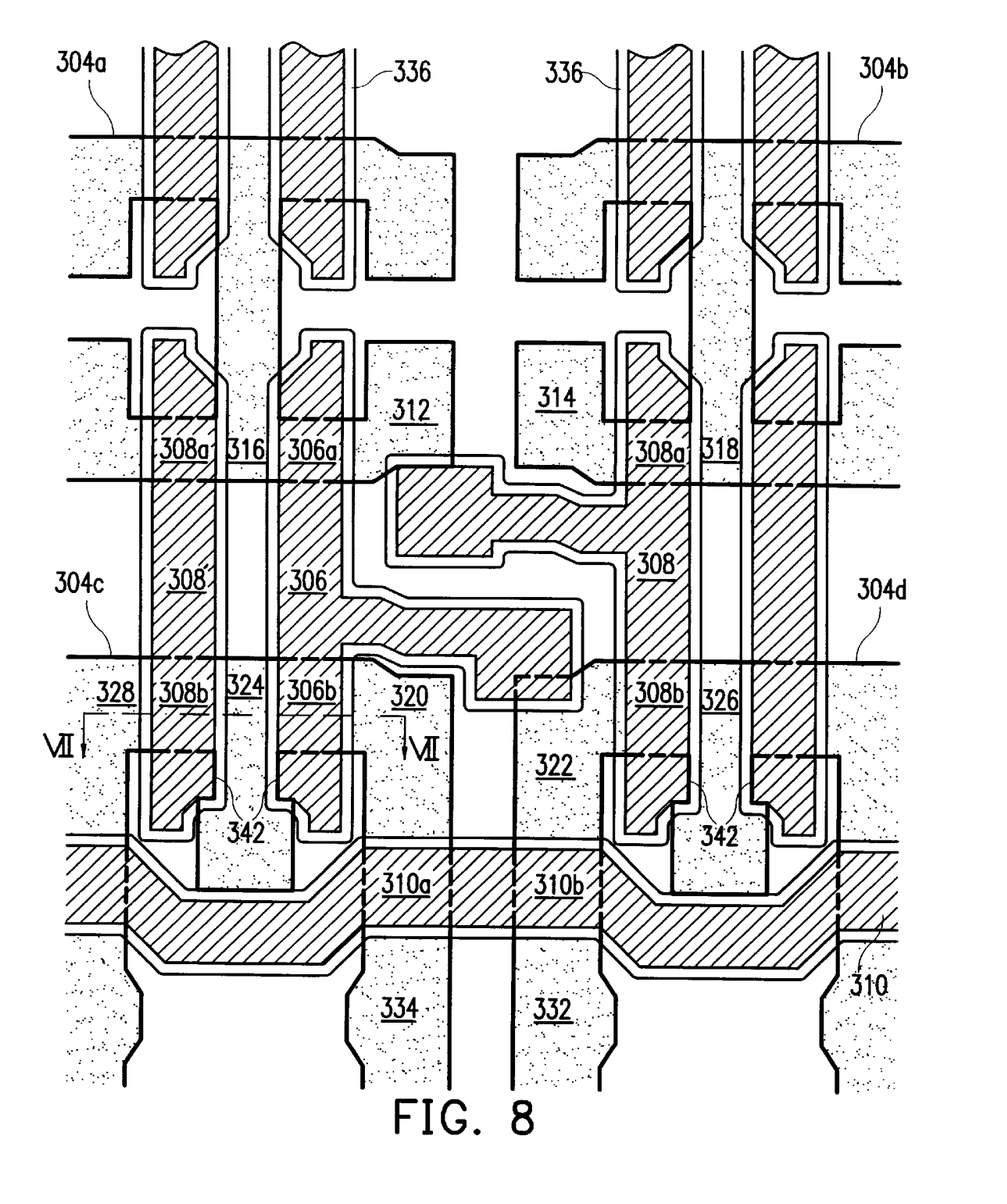
Figure 9:
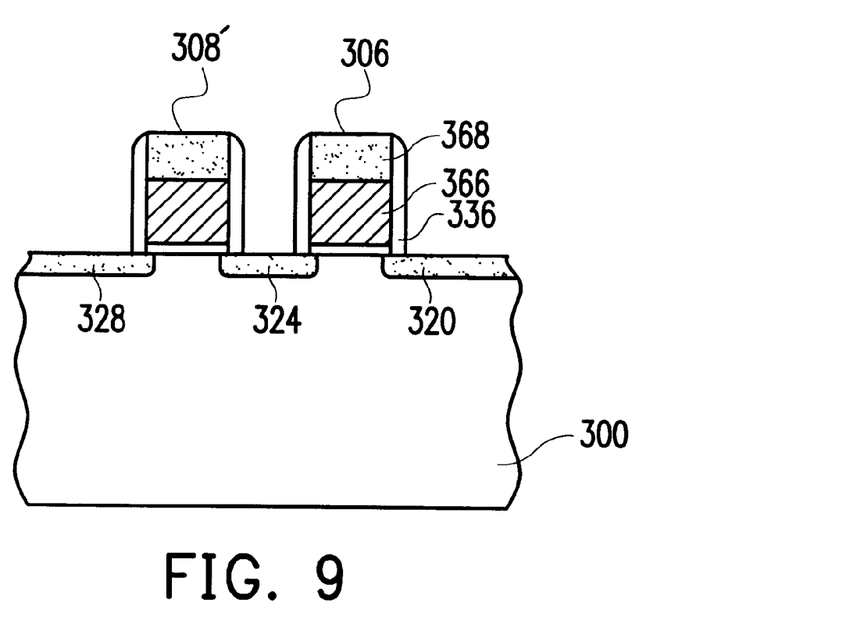

Referring to FIG. 8 and FIG. 9, a cross sectional view along the line VII—VII in FIG. 8, a thin spacer 336 is formed on each of the sidewalls of the stacked gates 306, 308, 308' and 310. The thin spacer 336 does not completely cover the lightly doped source regions 316, 318, 324, 326, 332, 334 and the lightly doped drain regions 312, 314, 320, 322, and 328. That is, parts of the light doped source and drain regions 316, 318, 324, 326, 332, 334, 312, 314, 320, 322, 328 are exposed. The material for forming the thin spacer 336 includes silicon oxide, and the method for forming the thin spacer 336 includes chemical vapor deposition and anisotropic etch back.

Figure 10:
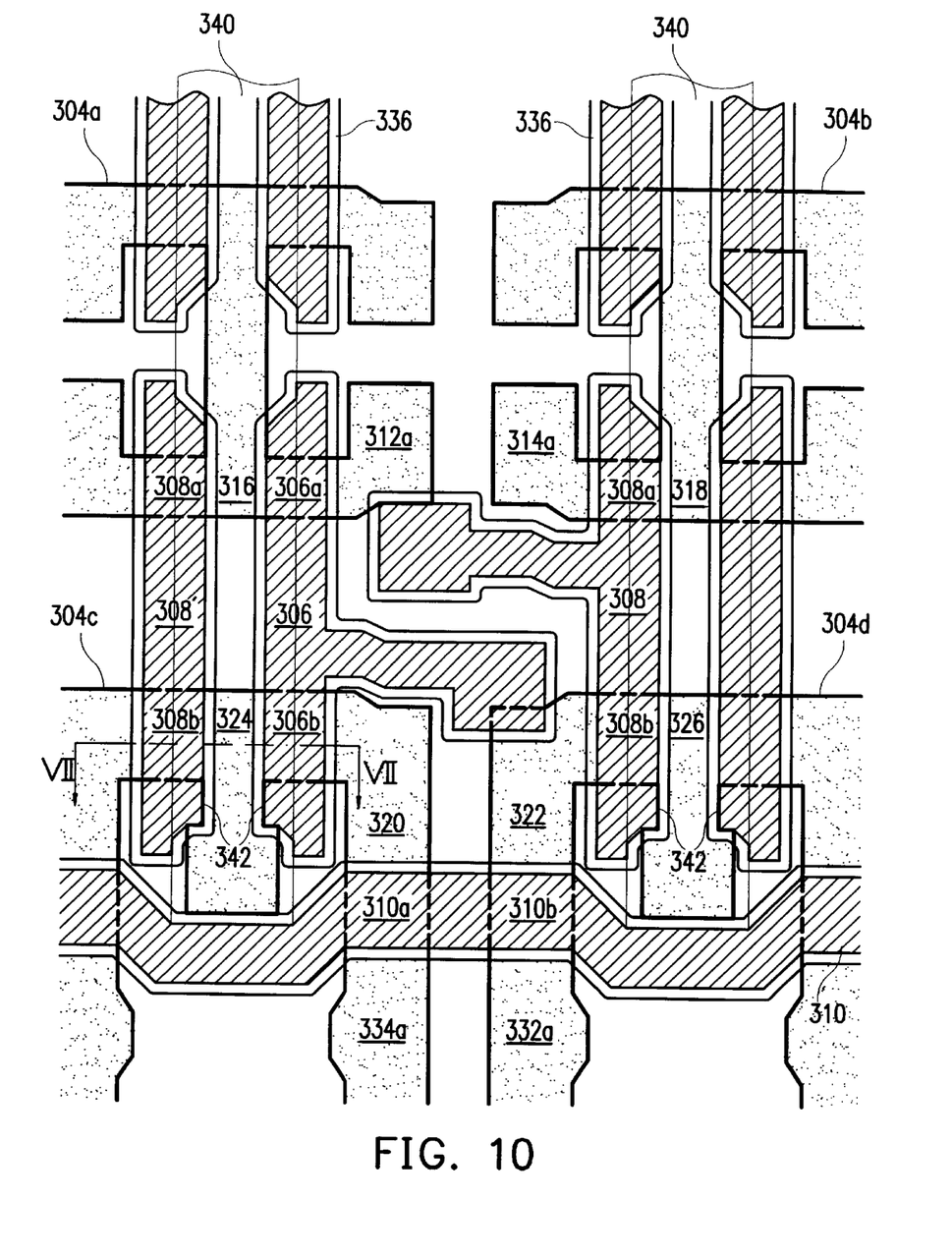
Figure 11:
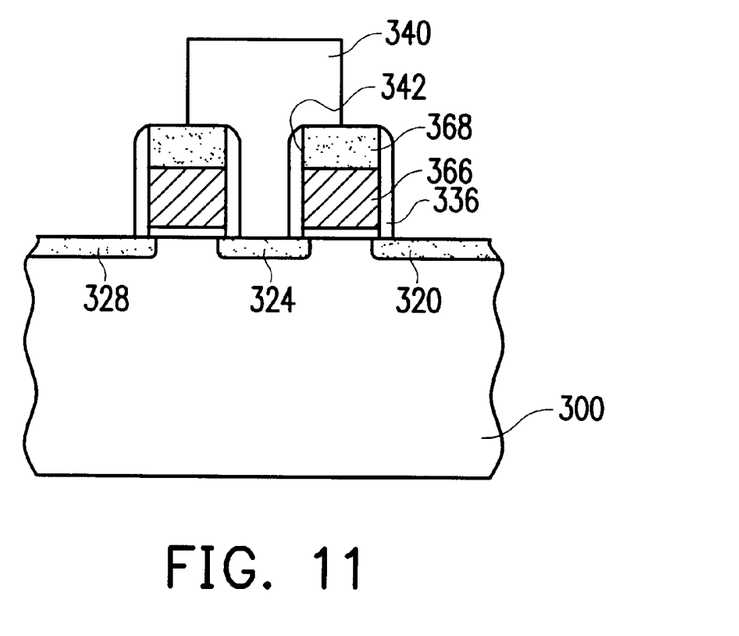

Referring to FIG. 10 and FIG. 11, a cross sectional view along the line VII—VII of FIG. 10, a mask layer 340 is formed over the substrate 300. The mask layer 340 includes a photoresist layer, for example. The mask layer 340 covers at least the thin spacer 336 on the source region 324 between stacked gates 306, 308' (the stacked gates of the pull down device and the load device) as a protection to prevent the thin spacer 336 on the source region 324 from being damaged by etching.

Figure 12:
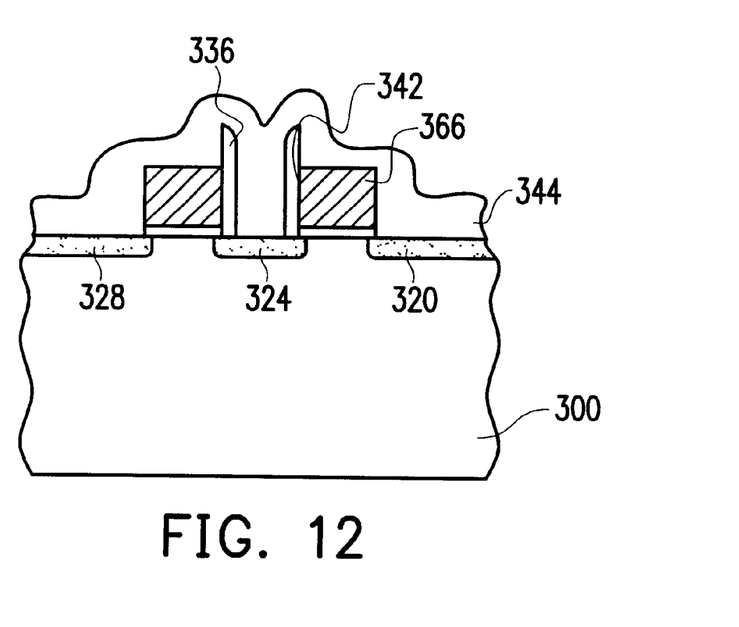

In FIG. 12, the mask layer 340 is removed to leave the thin spacer 336 on the stacked gate 306 (the stacked gate of the pull down and load devices) at the side 342 of the source region 324. The cap layer 368 is removed. The method to remove the cap layer 368 includes wet etching. When the cap layer 368 is made of silicon nitride, hot phosphoric acid is preferably used as the etchant. After the cap layer 368 is removed, the top portion of the remaining thin spacer 336 on the sidewall of the stacked gate 306 is higher than the top surface of the conductive layer 366.

An insulating layer 344 is formed over the substrate 300. The etching rate of the insulating layer 344 is different from the etching rate of the thin spacer 336. Preferably, the insulating layer 344 is made of silicon nitride, and the method of forming the insulating layer includes low pressure chemical vapor deposition.

Figure 13:
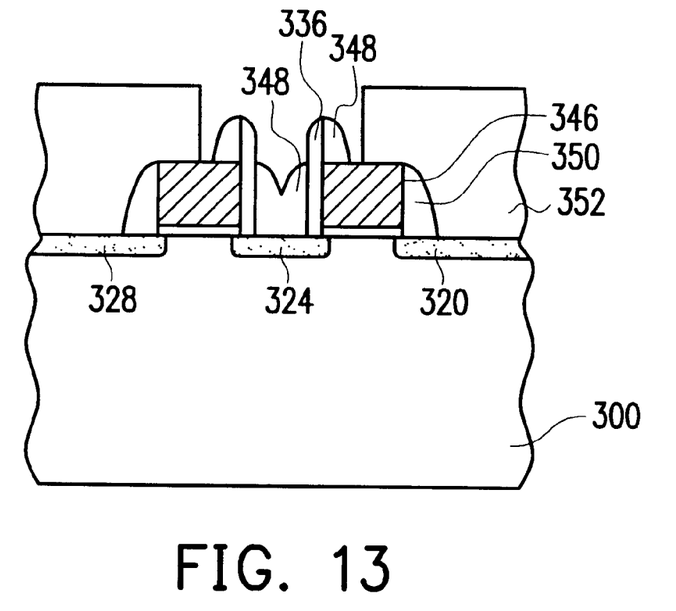

In FIG. 13, an anisotropic etching step is performed to etch back the insulating layer 344, so that a thick spacer 350 is formed on the sidewalls of the stacked gates 306, 308 on the drain regions 320 and 328. For example, as shown in FIG. 13, the thick spacer 350 is formed on the sidewall 346 of the gate 306 at the side of the drain region 320. Meanwhile, a residual spacer 348 is formed on a sidewall of the top portion of the thin spacer 336 protruding over the top surface of the conductive layer 366.

A mask layer 352, for example, a photoresist layer, is formed over the substrate 300 to cover at least the thick spacer 350, and to leave the residual spacer 348 exposed.

Figure 14:
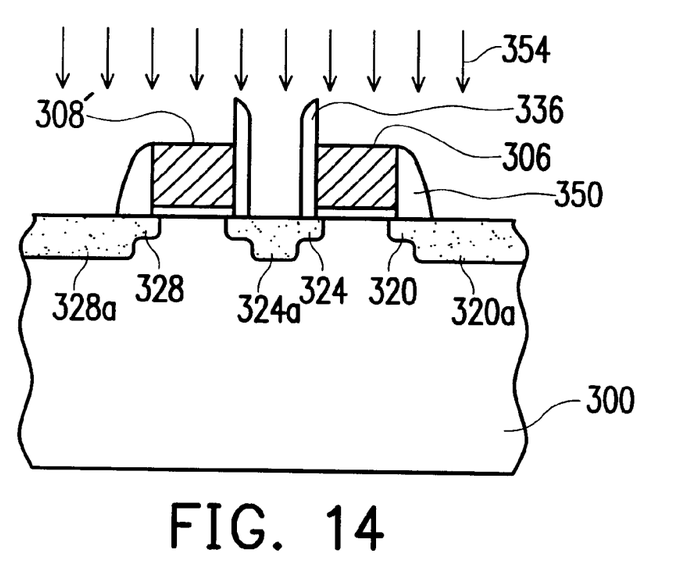
Figure 15:
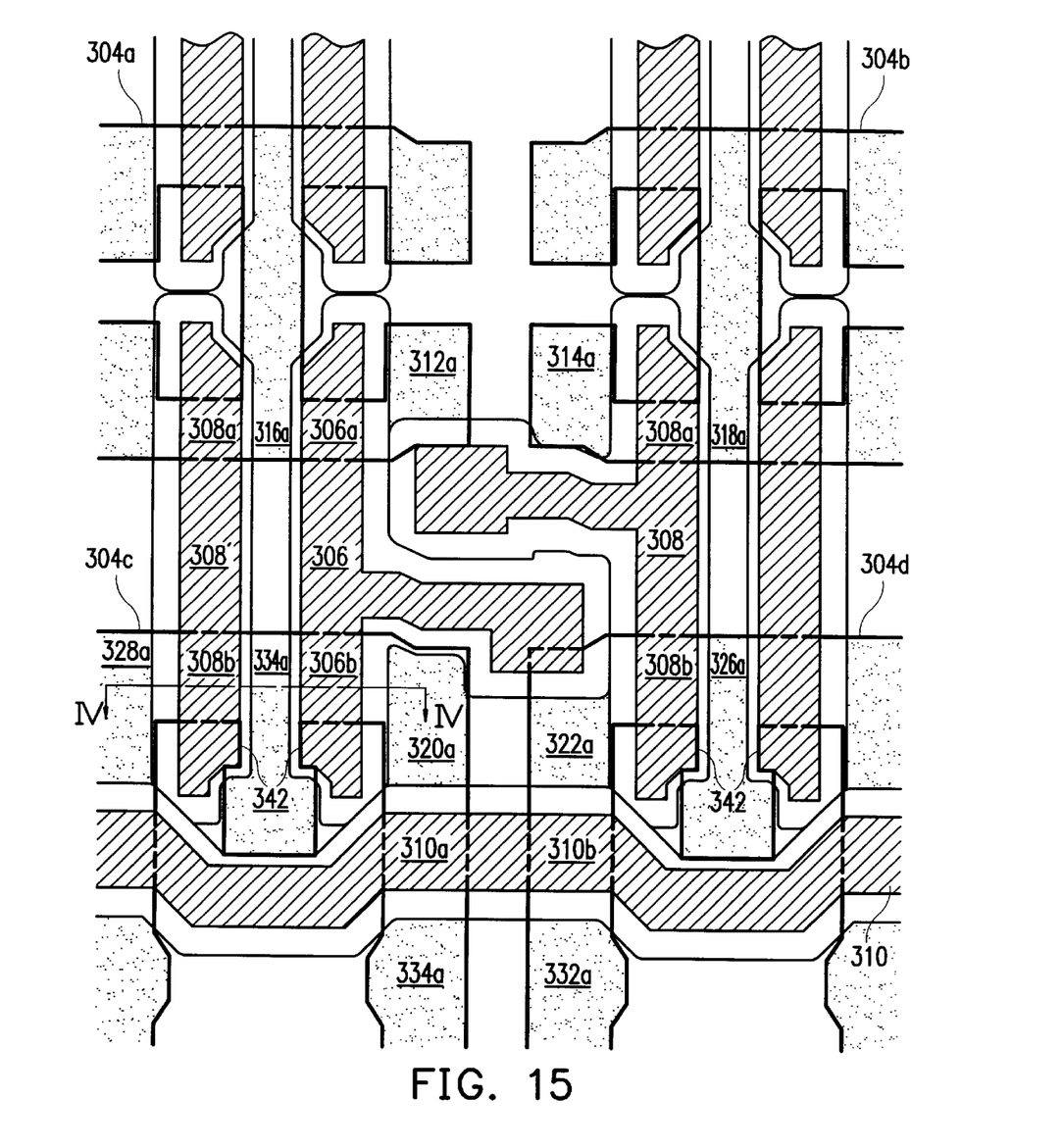

In FIG. 14, the residual spacer 348 is removed, preferably, by wet etching using phosphoric acid, as the residual spacer 348 is made of silicon nitride. As the materials of the thin spacer 336 and the residual spacer 348 are different, the thin spacer 336 is not etched or damaged while etching the residual spacer 348. After removing the residual spacer 348, the mask layer 352 is removed. A top view is shown as FIG. 15. In FIG. 15, the thin spacer 336 is formed on the sidewalls 342 of the stacked gates 306, 308, 308' at the side of the source region, while the thick spacer 350 is formed on the sidewall 346 at the side of the drain regions only.

Referring to FIGS. 14 and 15, a heavily doped ion implantation step 354 is then performed to form heavily doped source regions 316a, 318a, 324a, 326a, 332a, 334a and heavily doped drain regions 312a, 314a, 320a, 322a, 328a. It is worth noting that the thin spacer 336 is formed on the sidewall 342 of the stacked gate 308' at the side of the source region for another memory cell. The thin spacer 336 does not cover the lightly doped source regions 316, 324 in between stacked gates 306 and 308'. Thus, the heavily doped ions implanted in the step 354 are implanted into the source region between the stacked gates 306 and 308' of two neighboring memory cells. When the current flows from the drain region 320a of the pull down device through source region 324a between the stacked gates 306 and 308', as the source region 324a is now doped with heavily doped ions, the resistance is effectively reduced.

Figure 16:
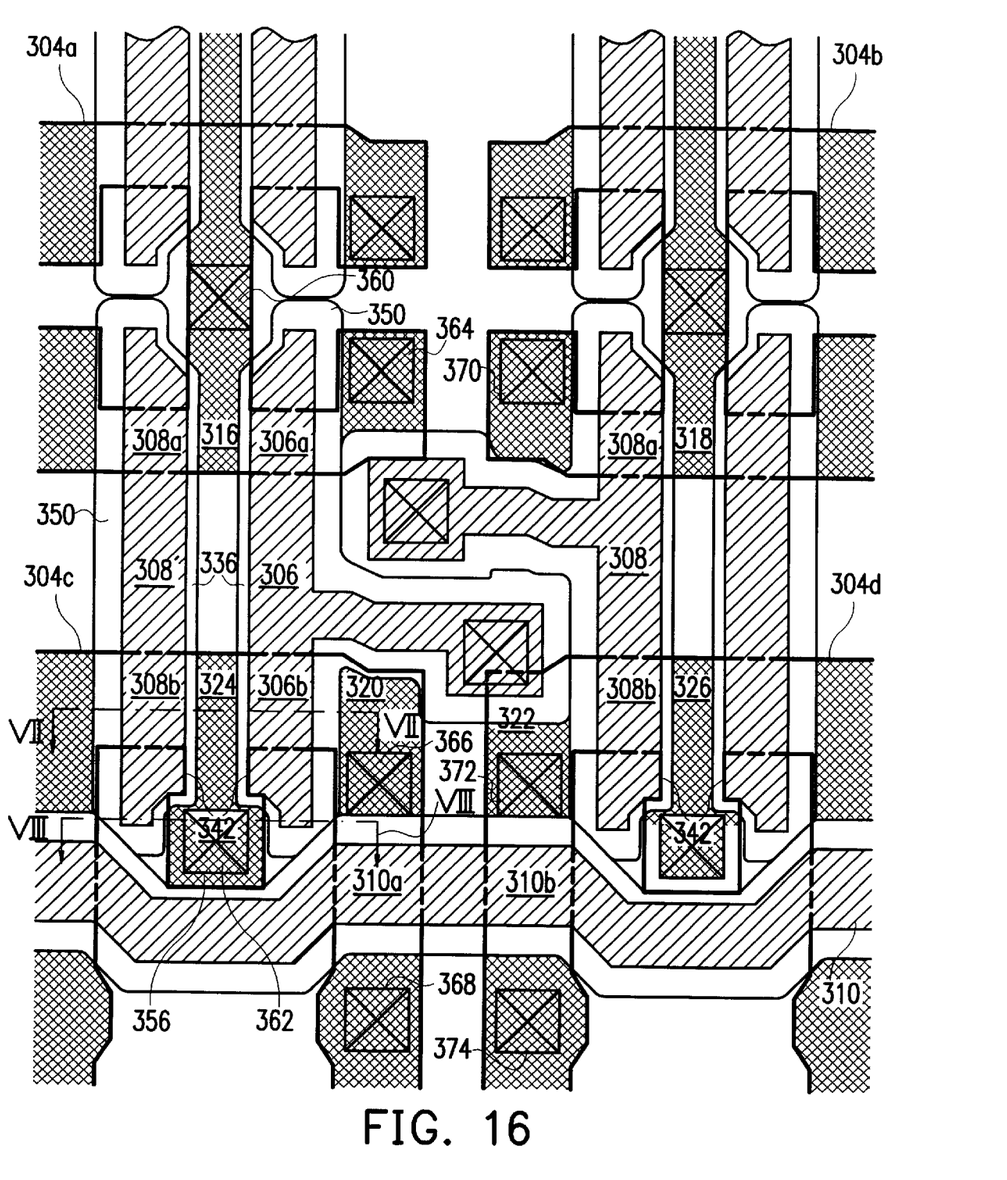
Figure 17:
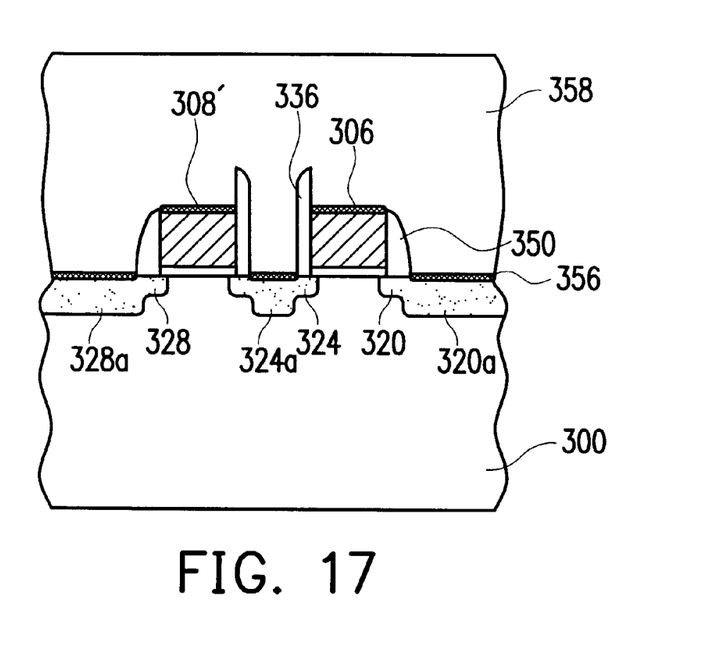
Figure 18:
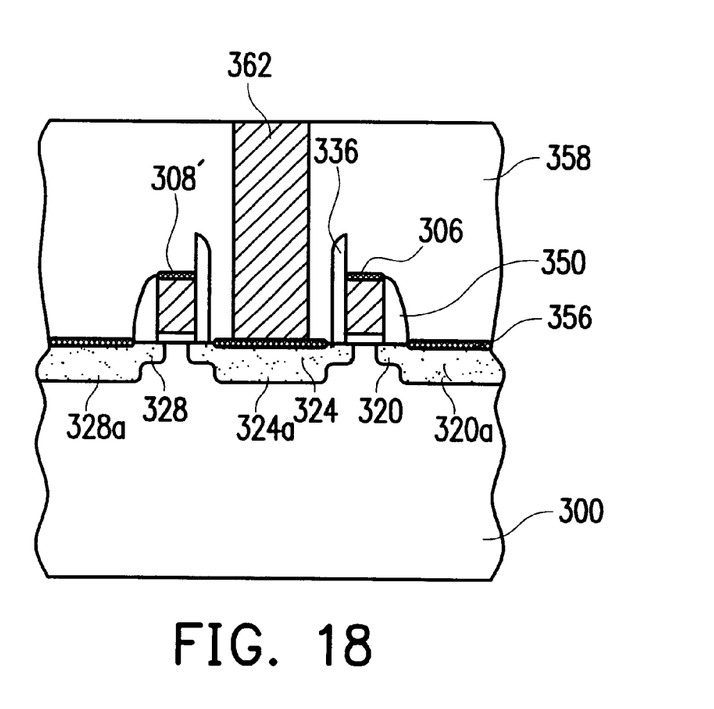

Referring to FIG. 16, 17 and 18, a step of self-aligned silicidation is performed. FIG. 17 is a cross sectional view of FIG. 16 cutting along the line VII—VII, while FIG. 18 is another cross sectional view of FIG. 16 cutting along the line VIII—VIII. Referring to FIG. 16, a metal silicide layer 356 is formed on the heavily doped source and drain regions 316a, 318a, 324a, 326a, 332a, 334a and 312a, 314a, 320a, 322a, 328a. As the top of the thin spacer 336 is higher than the top surface of the conductive layer 366, the bridging effect between the conductive layer 366 and the source and drain regions is eliminated.

Referring to FIG. 17, a dielectric layer 358 is then formed over the substrate 300. The material of the dielectric layer 358 includes, for example, silicon oxide formed by chemical vapor deposition. Referring to FIG. 18, a photolithography and etching step is performed to form an opening in the dielectric layer 358. Referring to FIGS. 16 and 18, a conductive layer is then formed in the opening 358 to form the contact windows 360, 362, 364, 366, 368, 370, 372 and 374. The contact window 362 is to connect the ground voltage Vss. Due to formation of the thin spacer 336 on the sidewalls 342 of the stacked gate 306 and the stacked gate 308' of a neighboring memory cell, if misalignment occurs while forming the contact window, the contact window will not land on the thin spacer 336. Instead, it will land on the metal silicide layer 356 on the source region 324a as shown in FIG. 18.

The subsequent metallization is then performed without further description.

Simply speaking, the thin spacer formed on the source region and the thick spacer formed on the drain region of the pull down device allows for the formation of a heavily doped source region and a metal silicide layer on the source region. As a result, the current flowing through the source region has a much reduced resistance. In addition, the contact window to connect the ground voltage Vss completely lands on the metal silicide layer on the source region. The cell ratio between the pull down device and the pass gate device in the low power/low voltage static random access memory is thus increased to enhance the stability of the static random access memory.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a static random access memory, comprising:

forming a stacked gate on a substrate;

forming a lightly doped source region and a lightly doped drain region in the substrate at two sides of the stacked gate;

forming a first spacer on a sidewall of the stacked gate at the side of the lightly doped source region, wherein the first spacer covers a part of the lightly doped source region and leaves the other part of the lightly doped source region exposed;

forming a second spacer on the other sidewall of the stacked gate at the side of the lightly doped drain region, wherein the first spacer is thinner than the second spacer;

performing an ion implantation step with the first and second spacers as a mask to form a heavily doped source region and a heavily doped drain region in the substrate, the lightly and heavily doped source region forming a source region, while the lightly and heavily doped drain region forming a drain region;

performing a self-aligned silicidation step to form a metal silicide layer on the source region, the drain region and the stacked gate;

forming a dielectric layer over the substrate;

forming an opening in the dielectric layer to expose the metal silicide layer on the source region; and filling the opening with a conductive layer to form a ground voltage contact window.

2. The method according to claim 1, wherein the step of forming the thin spacer further comprising:

forming a cap layer on the stacked gate;

forming a first and a second thin spacer on sidewalls of the stacked gate at the sides of the drain region and the source region;

forming a mask layer over the substrate to cover the first thin spacer and to expose the second thin spacer;

removing the second thin spacer; and removing the mask layer and the cap layer.

3. The method according to claim 2, wherein the step of forming the cap layer includes a step for forming a silicon nitride layer using chemical vapor deposition.

4. The method according to claim 2, wherein the step of forming the first and second thin spacers includes a step of forming a silicon oxide layer using chemical vapor deposition.

5. The method according to claim 1, wherein the step of forming the thick spacer includes a step of forming a silicon nitride layer using chemical vapor deposition.

6. The method according to claim 2, wherein the step of forming the mask layer includes a step of forming a patterned photoresist layer.

7. The method according to claim 1, wherein the step of forming the second spacer further comprising the following steps:

forming an insulating layer over the substrate;

performing an anisotropic etching step on the insulating layer to form the second spacer on the sidewall of the stacked gate at the side of the drain region, and to remain a residual spacer on a sidewall of a portion of the first spacer that protrudes over the stacked gate; and removing the residual spacer.

8. The method according to claim 1, wherein the step of forming the first spacer comprises a step of forming a silicon oxide using chemical vapor deposition.

9. The method according to claim 1, wherein the step of forming the second spacer comprises a step of forming a silicon nitride layer using chemical vapor deposition.

10. A method of fabricating a static random access memory, comprising:

forming a plurality of stacked gates on a substrate for fabricating a plurality of pass gate devices, a plurality of pull down devices and a plurality of load devices, wherein each of the stacked gates comprises a cap layer thereon;

forming a plurality of lightly doped source regions and a plurality of lightly doped drain regions in the substrate between the alternate pair of stacked gates;

forming a first spacer and a second spacer on each sidewall of the stacked gate on each lightly doped source region and each lightly doped drain region, respectively, wherein the first spacers only partly cover of the lightly doped source regions, so that parts of the lightly doped source regions are exposed;

forming a mask layer over the substrate to cover the first spacers and portions of the cap layers, while the second spacers are exposed;

removing the second spacers;

removing the mask layer and the cap layer, so that the top portions of the first spacers protrude over the stacked gate;

forming an insulating layer over the substrate;

anisotropically etching the insulating layer to form a plurality of third spacers on sidewalls of the stacked gates at the side of the lightly doped drain regions and a plurality of residual spacers on sidewalls of the top portions of the first spacers, wherein the third spacers are thicker than the first spacers;

removing the residual spacers;

performing a heavily doped ion implantation step using the first and the third spacers as a mask to form a plurality of heavily doped source and drain regions, the lightly and heavily doped source regions forming a plurality of source regions, and the lightly and heavily doped drain regions forming a plurality of drain regions; and performing a self-aligned metal silicidation step to form a metal silicide layer on the stacked gate, the source and the drain regions.

11. The method according to claim 10, wherein the pull down devices include NMOS devices.

12. The method according to claim 10, wherein the load devices include PMOS load devices.

13. The method according to claim 10, wherein the step of forming the cap layer includes a step of forming a silicon nitride layer using chemical vapor deposition.

14. The method according to claim 13, wherein the step of forming the first and second spacers includes a step of forming a silicon oxide layer using chemical vapor deposition.

15. The method according to claim 10, wherein the step of forming the insulating layer includes a step of forming a silicon nitride layer using chemical vapor deposition.

16. The method according to claim 10, wherein the step of forming the mask layer includes a step of forming a patterned photoresist layer.

17. The method according to claim 10, comprising further the following steps:

forming a dielectric layer over the substrate, forming a plurality of openings to expose the metal silicide layer on the source regions; and filling the openings with a conductive layer to form a plurality of contact windows.

18. The method according to claim 17, wherein the contact windows are coupled to a ground voltage.

* * * * *